(12) United States Patent
Shin et al.

(10) Patent No.: US 8,968,587 B2
(45) Date of Patent: Mar. 3, 2015

(54) GRAPHENE NANO RIBBONS AND METHODS OF PREPARING THE SAME

(75) Inventors: Hyeon-jin Shin, Suwon-si (KR); Jae-young Choi, Suwon-si (KR); Young-hee Lee, Suwon-si (KR); Gang-hee Han, Bucheon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 924 days.

(21) Appl. No.: 13/153,755

(22) Filed: Jun. 6, 2011

(65) Prior Publication Data

US 2011/0300338 A1    Dec. 8, 2011

(30) Foreign Application Priority Data

Jun. 4, 2010   (KR) .................. 10-2010-0053031

(51) Int. Cl.
| | | |
|---|---|---|
| *B44C 1/22* | (2006.01) | |
| *C01B 31/04* | (2006.01) | |
| *B82Y 30/00* | (2011.01) | |
| *B82Y 40/00* | (2011.01) | |
| *H01L 29/66* | (2006.01) | |
| *H01L 29/786* | (2006.01) | |
| *H01M 4/1393* | (2010.01) | |
| *H01M 8/02* | (2006.01) | |
| *H01M 4/88* | (2006.01) | |
| *H01L 51/00* | (2006.01) | |
| *H01M 10/052* | (2010.01) | |

(52) U.S. Cl.
CPC .............. *C01B 31/0484* (2013.01); *B82Y 30/00* (2013.01); *B82Y 40/00* (2013.01); *C01B 31/0446* (2013.01); *H01L 29/66742* (2013.01); *H01L 29/78684* (2013.01); *H01M 4/1393* (2013.01); *H01M 8/0202* (2013.01); *H01M 4/8817* (2013.01); *H01M 4/8867* (2013.01); *C01B 2204/06* (2013.01); *H01L 51/0016* (2013.01); *H01M 10/052* (2013.01); *Y02E 60/122* (2013.01); *Y02E 60/50* (2013.01)
USPC .................................. 216/51; 216/67; 216/81

(58) Field of Classification Search
CPC ....... B82Y 30/00; B82Y 40/00; H01M 4/133; H01M 4/1393; C01B 31/0484; C01B 2204/02; C01B 2204/06
USPC ............................. 216/67, 51, 81; 428/195.1
See application file for complete search history.

(56) References Cited

U.S. PATENT DOCUMENTS

| | | | | |
|---|---|---|---|---|
| 3,890,176 A | * | 6/1975 | Bolon ........................... | 438/708 |
| 7,015,142 B2 | * | 3/2006 | DeHeer et al. ................ | 438/689 |

FOREIGN PATENT DOCUMENTS

| | | |
|---|---|---|
| JP | 2002-356317 A | 12/2002 |
| JP | 2009-234815 A | 10/2009 |
| KR | 2010-0016928 A | 2/2010 |

OTHER PUBLICATIONS

Han et al. "Energy Band-Gap Engineering of Graphene Nanoribbons", Phys Rev. Lett, 2007, 98, p. 206805-1 to 206805-4.*

* cited by examiner

*Primary Examiner* — Gerard Higgins
(74) *Attorney, Agent, or Firm* — Harness, Dickey & Pierce, P.L.C.

(57) ABSTRACT

Methods of preparing graphene nano ribbons may include forming a graphene sheet on at least one surface of a substrate, forming a plasma mask having a nano pattern on the graphene sheet, and forming a nano pattern on the graphene sheet by plasma treating a stack structure on which the plasma mask is formed.

15 Claims, 4 Drawing Sheets

GRAPHENE NANO RIBBONS AND METHODS OF PREPARING THE SAME

CROSS-REFERENCE TO RELATED APPLICATION

This application claims priority under 35 U.S.C. §119 to Korean Patent Application No. 10-2010-0053031, filed on Jun. 4, 2010, in the Korean Intellectual Property Office (KIPO), the entire contents of which is incorporated herein by reference.

BACKGROUND

1. Field

Example embodiments relate to methods of preparing graphene nano ribbons and graphene nano ribbons prepared by using the methods.

2. Description of the Related Art

Generally, graphite is an allotropic form of the element carbon with a structure in which two-dimensional ("2D") graphene sheets are stacked. There are two allotropic forms with different stacking arrangements, hexagonal and rhombohedral. The carbon atoms of the graphene sheets are connected to each other in an extended array of hexagonal rings. One or more graphene sheets may be removed from the graphite to study the characteristics of a single graphene sheet, and it may be observed that a graphene sheet provides very useful characteristics as compared to other materials.

The electrical characteristics of a graphene sheet are dependent upon a crystallographic orientation of the graphene sheet. Accordingly, the electrical characteristics of a graphene sheet may be selected and a device including graphene may be designed. A graphene sheet may be used, for example, in a carbon-based electrical device or a carbon-based electromagnetic device.

In order to realize semiconductor characteristics of graphene, a thickness of the graphene may be adjusted to a nano pattern so as to adjust a band gap. In order to form a graphene nano pattern having a thickness of about 1 μm or below, strict process conditions and specialized equipment operating in a high vacuum are required.

SUMMARY

Example embodiments may provide methods of preparing graphene nano ribbons in an economical way under improved conditions. Example embodiments may provide graphene nano ribbons prepared by using the methods. Example embodiments may provide transparent electrodes or electrical devices using the graphene nano ribbons.

According to example embodiments, a method of preparing a graphene nano ribbon includes forming a graphene sheet on at least one surface of a substrate, forming a plasma mask having a nano pattern on the graphene sheet, and forming a nano pattern on the graphene sheet by plasma treating a stack structure on which the plasma mask is formed.

The forming of the plasma mask having a nano pattern may include stacking amorphous carbon on the graphene sheet and forming a nano pattern on the amorphous carbon by irradiating light to the amorphous carbon. The nano pattern may be formed on the graphene sheet and and then the plasma mask may be removed by using, for example, thermal treatment. The graphene sheet may have 1-10 layers. The graphene sheet may have 1 or 2 layers. The light irradiation may include laser light irradiation. The plasma may be controlled by an appropriate intensity according to the thickness of the graphene sheet in the plasma processing. The thermal treatment may be performed for about 10 minutes to about 5 hours at about 400 to about 1200° C. under the condition that $O_2$, $H_2$, $CH_4$, $C_2H_4$, or $C_2H_2$ is independently used or at least two of $O_2$, $H_2$, $CH_4$, $C_2H_4$, and $C_2H_2$ are mixed.

The substrate may include at least one selected from the group consisting of an inorganic substrate such as a silicon (Si) substrate, a glass substrate, a GaN substrate, or a silica substrate, and a metal substrate including nickel (Ni), cobalt (Co), iron (Fe), platinum (Pt), palladium (Pd), gold (Au), aluminum (Al), chromium (Cr), copper (Cu), manganese (Mn), molybdenum (Mo), rhodium (Rh), iridium (Ir), tantalum (Ta), titanium (Ti), tungsten (W), uranium (U), vanadium (V), or zirconium (Zr). The substrate may include, for example, an inorganic substrate and a metal substrate. The graphene sheet may have an area of about 1 $cm^2$ or above. The graphene sheet may have 10 or less wrinkles per an area of 1000 $\mu m^2$ of the graphene. The graphene sheet may be present in an area of 99% or greater per 1 $mm^2$ of the graphene.

According to example embodiments, a graphene nano ribbon prepared according to methods of forming a graphene nano ribbon is provided. According to example embodiments, the graphene nano ribbon may be applied to various fields such as transparent electrodes or electric devices.

According to at least one example embodiment, a method of preparing a graphene nano ribbon includes depositing a graphene sheet on at least one surface of a substrate, forming a plasma mask with a nano pattern on the graphene sheet; and forming a nano pattern in the graphene sheet by plasma treating a stack structure including the plasma mask.

According to at least one example embodiment, a method of preparing a graphene nano ribbon includes plasma treating a graphene sheet including at least one graphene layer to form a graphene pattern.

BRIEF DESCRIPTION OF THE DRAWINGS

Example embodiments will be more clearly understood from the following brief description taken in conjunction with the accompanying drawings.

FIG. 1 is a diagram illustrating methods of preparing graphene nano ribbons according to example embodiments;

FIG. 2 is a cross-sectional diagram of a solar cell including graphene nano ribbons according to example embodiments;

FIG. 3 is a perspective exploded view of a fuel cell including graphene nano ribbons according to example embodiments;

Figure 1:
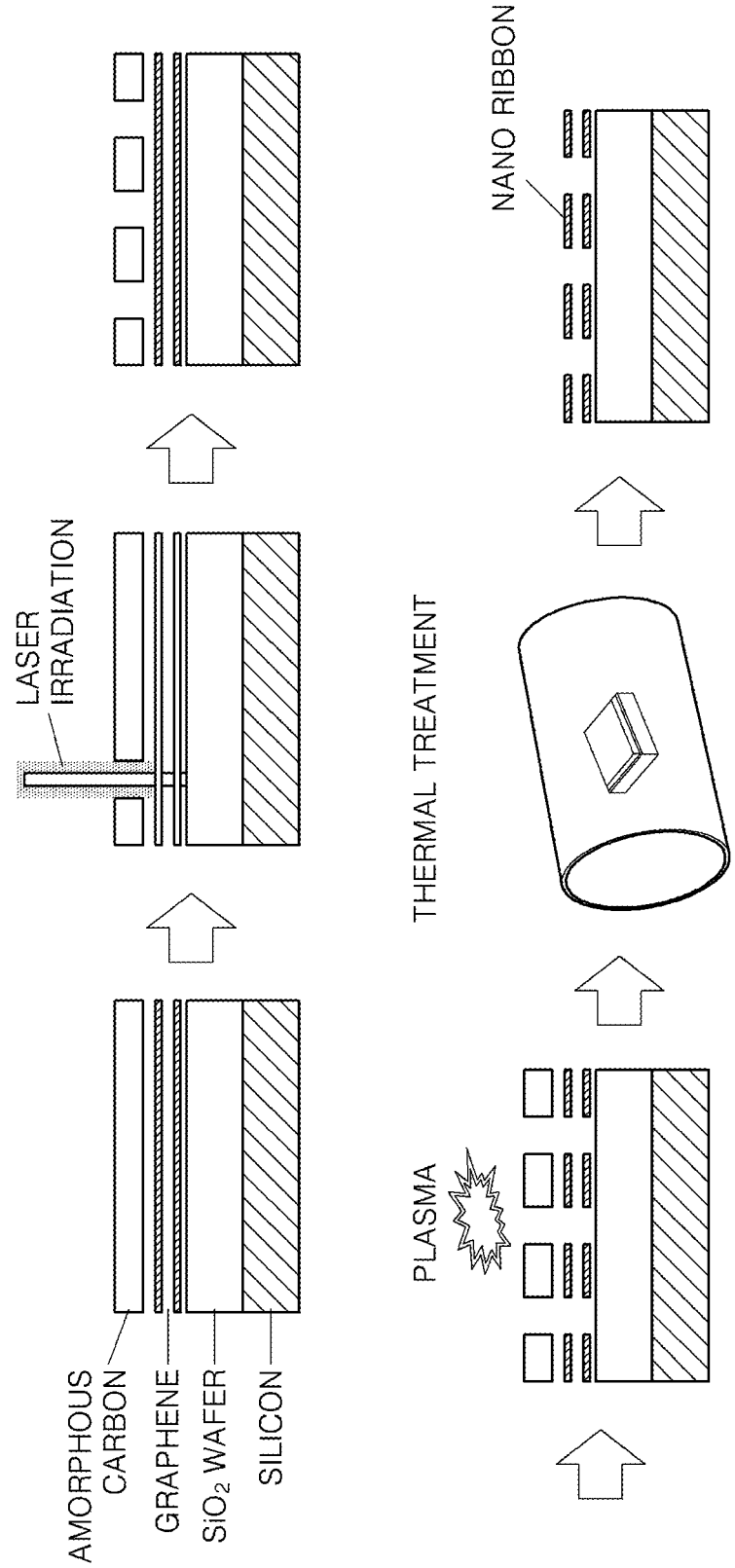
FIGS. 1-3 represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/ or structural elements may be reduced or exaggerated for clarity. The use of similar or identical reference numbers in the various drawings is intended to indicate the presence of a similar or identical element or feature.

DETAILED DESCRIPTION

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

A general e-beam lithography method may require a high-degree vacuum, an expensive specific resist composition, and standard limitations on a substrate and thus economical efficiency may be deteriorated.

According to example embodiments, methods of preparing graphene nano ribbons may provided. A plasma mask with a nano pattern may be formed on graphene and may be plasma processed so as to form a graphene nano pattern. A graphene nano ribbon may be formed. Methods of preparing graphene nano ribbons according to example embodiments may be performed under normal atmospheric conditions and may use a plasma mask including amorphous carbon (e.g., instead of an expensive resist composition) thereby economically preparing graphene nano ribbons.

The term "graphene", as used herein, may refer to a polycyclic aromatic molecule comprising a plurality of carbon atoms connected to each other by a covalent bond. The plurality of carbon atoms may form a six-membered ring as a standard repeating unit, or may further include 5-membered rings and/or 7-membered rings, for example. The graphene may appear as a single layer of covalently bonded carbon atoms having general $sp^2$ hybridization. A plurality of graphene layers may often be referred to in the art as graphite. However, for convenience, "graphene," as used herein, may comprise one or more layers of graphene. Thus, as used herein, graphene may refer to a single layer, or also may refer to a plurality of layers of stacked single layers. Methods of preparing graphene nano ribbons according to example embodiments may include the use of a number of graphene layers, for example, 1-10 (e.g., 1 or 2). Example embodiments are not limited thereto and a thickness of the graphene layer is not limited.

According to example embodiments, sheet-form graphene may be formed on at least one surface of a substrate, and the graphene may be prepared by using, for example, a vapor phase method, a liquid phase method, a polymer method, and/or the like. The graphene may be deposited by transferring graphene and/or by forming graphene on the substrate. For example, the prepared graphene may be transferred onto a substrate or the graphene may be prepared on the substrate directly. A plasma mask with a nano pattern may be formed on the graphene. The plasma mask may be used to form a nano pattern on the graphene according to a light irradiating process. Plasma may pass through an opening in the plasma mask and the graphene may be removed by, for example, combustion. Plasma may not pass a closed part of the plasma mask and graphene may remain so that one or more nano patterns are formed in the graphene. A material used to form the plasma mask may include, for example, amorphous carbon. Any material for forming a nano pattern may be used. A material may be formed on the graphene and a nano pattern may be formed by light irradiating the material.

According to example embodiments, amorphous carbon may be used to form a plasma mask. Graphene may be, for example, transferred and/or formed on at least one surface of a substrate. A source of amorphous carbon, for example, $CH_4$, $C_2H_4$, and/or $C_2H_4$ may be used to deposit amorphous carbon on the graphene to a thickness of about 10 nm to about 1 μm. A deposition method may include, for example, chemical vapor deposition (CVD) and/or sputtering. Amorphous carbon may be deposited on one surface of the graphene and then a nano pattern with a width of about 1 μm or below (e.g., about 1 to about 1,000 nm) may be formed in the amorphous carbon through light irradiation (e.g., laser light irradiation), thereby forming a plasma mask. Intensity of laser light while irradiating the amorphous carbon may vary according to a thickness of amorphous carbon. If a thickness of the amorphous carbon is great, the intensity of the laser light may be increased and if the amorphous carbon is relatively thin, the intensity of the laser light may be decreased. The wavelength of the laser light may be, for example, about 532 nm, and the intensity thereof may be, for example, about 0.01 to about 1 W.

A plasma mask with a nano pattern may be formed on the graphene and the graphene may be plasma processed, thereby forming the nano pattern in the graphene. The plasma may burn the graphene existing at an opened part of the plasma mask and the graphene may remain at a part where the plasma cannot pass through so that the nano pattern may be formed. Accordingly, the nano pattern may be formed in the graphene and then the plasma mask may be removed. A stack body including the nano pattern may be disposed in a separate thermal treatment chamber and then the plasma mask, for example, amorphous carbon, may be removed by thermal treatment. A vapor thermal treatment, for example, may be used as the thermal treatment and may be performed, by way of example, for about 10 minutes to about 5 hours at about 400 to about 1000° C. under the condition that $O_2$, $H_2$, $CH_4$, $C_2H_4$, or $C_2H_2$ is independently used or at least two of $O_2$, $H_2$, $CH_4$, $C_2H_4$, and $C_2H_2$ are mixed. As described above, the plasma mask formed on the graphene may be removed and thus a graphene nano ribbon on which the nano pattern is formed may be formed.

Examples of the substrate on which the graphene may be formed may include at least one of an inorganic substrate (e.g., a silicon (Si) substrate, a glass substrate, a GaN substrate, and/or a silica substrate, and/or a metal substrate including nickel (Ni), cobalt (Co), iron (Fe), platinum (Pt), palladium (Pd), gold (Au), aluminum (Al), chromium (Cr), copper (Cu), manganese (Mn), molybdenum (Mo), rhodium (Rh), iridium (Ir), tantalum (Ta), titanium (Ti), tungsten (W), uranium (U), vanadium (V), and/or zirconium (Zr)) and a transparent polymer material (e.g., polyethylene terephthalate, polycarbonate, polyimide, and/or polyethylenenaphthalate). A thickness of the substrate is not particularly restricted and an appropriate thickness may be selected according to use.

FIG. 1 is a diagram illustrating methods of preparing graphene nano ribbons according to example embodiments. Although a specific combination of materials and methods is illustrated and described, the particular combination is an example only and example embodiments are not limited to the combination. Referring to FIG. 1, a silica ($SiO_2$) wafer may be deposited on silicon as a substrate. Graphene prepared by using a separate process may be transferred onto the substrate on which the silica ($SiO_2$) wafer is deposited. Amorphous carbon may be deposited on the graphene by using, for example, a plasma-enhanced chemical vapor deposition (PECVD) coating. Laser light of an intensity may be irradiated onto the amorphous carbon according to a pattern.

The amorphous carbon to which laser light is irradiated may be partially removed by combustion, thereby forming a nano pattern on the amorphous carbon. If the amorphous carbon on which the nano pattern is formed is plasma processed, the graphene may be burned from an area where plasma passes through and the graphene may remain at an area where plasma does not pass through so that a nano pattern is formed on the graphene. A graphene stack body on which the nano pattern is formed may be, for example, disposed in a same or separate thermal treatment chamber and vapor thermal treatment may be performed so that the amorphous carbon is removed and the graphene on which the nano pattern is formed remains on the substrate, thereby preparing graphene nano ribbons.

The graphene used in methods of preparing graphene nano ribbons according to example embodiments is not particularly restricted. Graphene with relatively few defects may be used according to the application of the graphene nano ribbons. The graphene may include 10 or fewer wrinkles, for example, about 5 or less or about 3 or less wrinkles, per an area of 1000 μm² of the graphene. The area occupied by the graphene may be an area of 1 mm² or greater. For example, an area of about 1 mm² to about 100 m² (e.g., an area of about 1 mm² to about 25 m²). Graphene may be present in an area of 99% or greater, for example, in an area of about 99% to about 99.999%, per 1 mm² of the graphene. If graphene is present in this area range, the graphene may be homogeneous, and thus may have uniform electrical characteristics.

Graphene used in methods of preparing graphene nano ribbons may be prepared in multiple ways and example embodiments are not limited to any particular method. For example, a vapor phase method and/or a liquid phase method may be used to form graphene on a graphitization catalyst metal film. Any well-known method may be also used.

In a vapor phase method, a graphitization catalyst may be formed as a film and may be thermally treated while inserting a vapor carbon source therein so as to generate graphene. The graphene may be grown while cooling. When a chamber including the graphitization catalyst as a film is thermally treated for a period of time at a temperature while supplying a vapor carbon source to the chamber at a pressure, carbon components existing in the vapor carbon source may be connected to each other so as to form a hexagonal stacked structure and thus the graphene may be generated. When the graphene is cooled at a cooling speed, graphene sheets with a uniform array may be formed on the graphitization catalyst metal film.

In forming graphene sheets, carbon may be supplied as a carbon source and any material that may be present in a vapor phase at a temperature of about, for example, 300° C. or above may be used. The vapor carbon source may be a compound including six or less carbon atoms, a compound including four or less carbon atoms, and/or a compound including two or less carbon atoms, for example. Examples of the vapor carbon source may include at least one of carbon monoxide, ethane, ethylene, ethanol, acetylene, propane, propylene, butane, butadiene, pentane, pentene, cyclopentadiene, hexane, cyclohexane, benzene, and/or toluene. The vapor carbon source may be injected into the chamber including the graphitization catalyst at a fixed pressure. In the chamber, the vapor carbon source may be used alone or in combination with an inert gas, for example, helium and/or argon.

Hydrogen may be used together with the vapor carbon source. Hydrogen may keep a surface of a metal layer containing a catalyst clean, and may control the reaction of the vapor carbon source with the metal layer. Hydrogen may be used in about 5 to about 40% by volume of the chamber, in about 10 to about 30% by volume, and/or in about 15 to about 25% by volume. When a vapor carbon source is injected into the chamber including the graphitization catalyst in the form of a film and then the chamber is thermally treated at a temperature, the graphene may be formed on the surface of the graphitization catalyst. The temperature in the thermal treatment may be important for generating the graphene and may be, for example, about 300 to about 2000° C. (e.g., about 500 to about 1500° C.).

The thermal treatment may be maintained for a period of time at a temperature and generation of the graphene may be controlled. When a thermal treatment is performed for a long period of time, the graphene may be increasingly generated and a thickness of a resultant graphene may increase. When a thermal treatment is performed for a shorter period of time, a thickness of a resultant graphene may decrease. In order to obtain a desired thickness of the graphene, the time taken to perform the thermal treatment may be important in addition to the type and supplied pressure of the carbon source, the type of the graphitization catalyst, and/or the size of the chamber, for example. The thermal treatment may be maintained for about 0.001 to about 1000 hours.

A heat source for the thermal treatment is not limited, and may supply, for example, induction heat, radiant heat, a laser, infrared (IR) heat, microwaves, plasma, ultraviolet (UV) rays, and/or surface plasmon heat. The heat source may be attached to the chamber and may increase the temperature in the chamber to a desired temperature. A selected cooling process may be performed on the resulting product obtained after the thermal treatment. The cooling process may be performed so that the patterned graphene is grown and arranged uniformly. Because sudden cooling may generate cracks in the graphene sheets, the resulting product may be slowly cooled at a uniform rate. For example, the resulting product may be cooled at a rate of about 0.1° C. to about 10° C. per minute, or may be cooled naturally (e.g., by ambient convection). The natural cooling of the resulting product may be performed by simply removing the heat source used for the thermal treatment. By only removing the heat source, a sufficient cooling rate may be obtained.

A thermal treatment and a cooling process may be performed for one cycle. A thermal treatment and a cooling process may be repeatedly performed so that graphene with multi-layers and a high-density structure may be generated. The graphitization catalyst may be used as a metal film with a stacked structure and may contact the carbon source. The graphitization catalyst may support formation of a hexagonal stacked structure obtained by connecting carbon components to each other, which are provided from the carbon source. For example, the graphitization catalyst may include a catalyst used in graphite synthesis, carbon reaction, and/or manufacture of carbon nanotubes. For example, the catalyst may include at least one of Ni, Co, Fe, Pt, Au, Al, Cr, Cu, Mg, Mn, Mo, Rh, Si, Ta, Ti, W, U, V, and/or Zr. The graphene may be obtained, by using the vapor phase method, from a pure vapor material and through thermal treatment at high temperature, thereby having a uniform structure without being damaged.

A polymer method may be also used to form graphene. In the polymer method, a liquid carbon-based material may contact the graphitization catalyst metal film. A carbon-containing polymer, which is a carbon-based material, may be coated on the substrate. Any carbon-containing polymer may be used as the carbon-based material. When a self-assembled polymer is used, the self-assembled polymer may be regularly arranged in a perpendicular direction on the surface of the catalyst and thus the patterned graphene, with a high density, may be formed. The self-assembled polymer, which forms a self-assembled layer, may be at least one self-assembled polymer selected from the group consisting of an amphiphilic polymer, a liquid crystal polymer, a conductive polymer, and/or a combination comprising at least one of the foregoing.

Because an amphiphilic polymer includes both hydrophilic and hydrophobic functional groups in a structure thereof, the amphiphilic polymer may be arranged in a uniform arrangement, for example, a Langmuir-Blodgett arrangement, a dipping arrangement, and/or a spin arrangement, in an aqueous solution. The amphiphilic polymer may include a hydrophilic functional group including at least one of an amino group, a hydroxyl group, a carboxyl group, a sulfate group, a sulfonate group, a phosphate group, a salt thereof, and/or a combination including at least one of the foregoing.

The amphiphilic polymer may include a hydrophobic functional group including at least one of a halogen atom, a $C_1$-$C_{30}$ alkyl group, a $C_1$-$C_{30}$ halogenated alkyl group, a $C_2$-$C_{30}$ alkenyl group, a $C_2$-$C_{30}$ halogenated alkenyl group, a $C_2$-$C_{30}$ alkynyl group, a $C_2$-$C_{30}$ halogenated alkynyl group, a $C_1$-$C_{30}$ alkoxy group, a $C_1$-$C_{30}$ halogenated alkoxy group, a $C_1$-$C_{30}$ heteroalkyl group, a $C_1$-$C_{30}$ halogenated heteroalkyl group, a $C_6$-$C_{30}$ aryl group, a $C_6$-$C_{30}$ halogenated aryl group, a $C_7$-$C_{30}$ arylalkyl group, a $C_7$-$C_{30}$ halogenated arylalkyl group, and/or a combination comprising at least one of the foregoing. Examples of the amphiphilic polymer may include a decanoic acid, a lauric acid, a palmitic acid, a stearic acid, a myristoleic acid, a palmitoleic acid, an oleic acid, a stearidonic acid, a linolenic acid, a caprylamine, a laurylamine, a stearylamine, an oleylamine, and/or a combination comprising at least one of the foregoing.

A liquid crystal polymer may be arranged in a uniform orientation in liquid. A conductive polymer may form a crystalline structure by self-assembling in a layer of the polymer while a solvent used to dissolve the conductive polymer vaporizes from the layer. The liquid crystal polymer and the conductive polymer may be arranged by a method, for example, by dipping, spin coating, and/or the like. Examples of the liquid crystal polymer and the conductive polymer may include a polyacetylene-based polymer, a polypyrrole-based polymer, a polythiophene-based polymer, a polyaniline-based polymer, a polyfluoro-based polymer, a poly(3-hexylthiophene)-based polymer, a polynaphthalene-based polymer, a poly(p-phenylene sulfide)-based polymer, a poly(p-phenylene vinylene)-based polymer, and/or a combination comprising at least one of the foregoing.

A carbon-containing polymer may include at least one polymerizable functional group, for example, a carbon-carbon double bond and/or carbon-carbon triple bond, in a structure thereof. The at least one polymerizable functional group may facilitate polymerization between polymers (e.g., cross-linking) through a polymerization process, for example, ultraviolet light irradiation. The carbon-based material obtained therefrom may be of a large molecular weight, and may reduce or effectively prevent carbon from being volatized during thermal treatment. Such a carbon-containing polymer may be polymerized before or after being coated on the graphitization catalyst. According to example embodiments, when the carbon-containing polymer is polymerized before being coated on a graphitization catalyst, a polymerization layer obtained through a separate polymerization process may be transferred onto the graphitization catalyst to obtain a carbon-based material layer. A polymerization process and a transferring process may be repeated several times to adjust the thickness of the graphene sheets.

The carbon-containing polymer may be arranged on the graphitization catalyst by any suitable method. For example, the carbon-containing polymer may be arranged on a surface of the graphitization catalyst using, for example, a Langmuir-Blodgett method, a dip coating method, a spin coating method, and/or a vacuum-deposition method. The carbon-containing polymer may be coated on a portion of or an entire surface of the graphitization catalyst. According to example embodiments, the molecular weight of a carbon-containing polymer, the thickness of a layer, and/or the number of self-assembled layers of the carbon-containing polymer arranged on the substrate may be selected according to the desired number of graphene layers. According to example embodiments, when a carbon-containing polymer with a large molecular weight is used, the amount of carbon may be high and the number of graphene layers may also high. A thickness of the graphene may be selected according to the molecular weight of the carbon-containing polymer.

An amphiphilic organic material may be a self-assembled organic material and include both a hydrophilic portion and a hydrophobic portion in its molecular structure. The hydrophobic portion of the amphiphilic organic material, for example, an amphiphilic polymer, may bind to the graphitization catalyst, which may be hydrophobic, and may be evenly arranged on the graphitization catalyst layer. The hydrophilic portion of the amphiphilic organic material may be exposed in a direction away from the substrate and may bind to a hydrophobic portion of the amphiphilic organic material, for example an amphiphilic polymer, which is not bonded to the graphitization catalyst layer. When the amount of the amphiphilic organic material is sufficient, the amphiphilic organic material may be sequentially stacked on the catalyst layer by hydrophilic-hydrophobic bonds. The amphiphilic organic material may be sequentially stacked on the catalyst layer to form a plurality of layers and a graphene layer may be formed by thermal treatment. By selecting a suitable amphiphilic organic material, and selecting a thickness of layers of the amphiphilic organic material by varying the amount of the amphiphilic organic material, the number of graphene layers may be selected. Graphene with a desired thickness may be prepared.

A liquid phase method may be also used to form graphene. In a liquid phase method, graphene may be formed by contacting a liquid carbon-based material with a graphitization catalyst metal film and performing thermal treatment. In a process of contacting a liquid carbon-based material with a graphitization catalyst metal film, the substrate may be immersed in the liquid carbon-based material, and may be pre-heated. The liquid carbon-based material may be, for example, any organic solvent containing carbon that may be thermally decomposed by a reaction with the graphitization catalyst. The liquid carbon-based material may be a polar organic solvent and/or non-polar organic solvent with a boiling point of about 60 to about 400° C.

Examples of organic solvents may include alcohol-based organic solvents, ether-based organic solvents, ketone-based organic solvents, ester-based organic solvent and/or organic acid-based organic solvents. An alcohol-based organic solvent and/or an ether-based organic solvent may be used in terms of adsorption by the graphitization metal catalyst, reactivity and reducing power. Examples of alcohol-based organic solvents may include monovalent alcohols and polyvalent alcohols, which may be used alone or in a combination thereof. Examples of monovalent alcohols may include propanol, pentaol, hexanol, heptanol, and octanol, and examples of polyvalent alcohols may include propylene glycol, diethylene glycol, dipropylene glycol, triethylene glycol, tripropylene glycol, octylene glycol, tetraethylene glycol, neopentyl glycol, 1,2-butandiol, 1,3-butandiol, 1,4-butandiol, 2,3-butandiol, 1,2-dimethyl-2,2-butandiol, and 1,3-dimethyl-2,2-butandiol. These monovalent alcohols and polyvalent alcohols may further include an ether group (e.g., in addition to a hydroxyl group).

When a liquid carbon-based material is used, the metal layer may be carburized by pre-heating. The liquid carbon-based material may be thermally decomposed during the pre-heating due to a reaction with the graphitization catalyst. A thermal decomposition process of a liquid carbon-based material by a graphitizing catalyst is well known and disclosed in, as one example, Nature, Vol. 418, page 964, the entire contents of which is incorporated herein by reference. For example, thermal decomposition products of an organic solvent, for example, polyvalent alcohol, may include alkane, $H_2$, $CO_2$, and/or $H_2O$, and a carbon component of the thermal decomposition products may permeate into a catalyst. A pre-heating process for the thermal decomposition may be performed for about 10 minutes to about 24 hours at a temperature of about 100 to about 400° C.

When a carburization method is used, the amount of carbon in the catalyst may be controlled by varying the degree of carburization. The thickness of a graphene layer formed in a subsequent process may also be controlled. For example, if a liquid carbon-based material that is prone to thermal decomposition is used, a large amount of carbon may be decomposed and permeated into the catalyst during the thermal decomposition reaction of the liquid carbon-based material. When the carburization process is controlled by varying thermal treatment temperature and duration, the amount of carbon permeated into the catalyst may be controlled. The rate of growth of graphene may be controlled. The thickness of the graphene layer may be controlled.

A carbon-containing polymer or a liquid carbon-based material may contact a graphitization catalyst metal film and may be thermally treated, thereby forming a graphene on the graphitization catalyst metal film. Such a thermal treatment may be performed in the same manner as in the vapor phase method.

The width of the pattern of the graphene nano ribbons prepared as above may be varied according to the use thereof so as to adjust a band gap and thus a semiconductor characteristic of the graphene may be realized. The graphene nano ribbons may be used in various display devices, for example, a field emission display ("FED"), a liquid crystal display ("LCD"), and/or an organic light emitting device ("OLED"). The graphene nano ribbons may be used in various electrical devices, for example, a super-capacitor, a nano-device, and/or an energy device. The graphene nano ribbons may be used in various energy devices, for example, a lithium battery, a solar cell and/or a fuel cell. The graphene nano ribbons may be used in various nano-devices, for example, a field-effect transistor ("FET"), and/or a memory device, a transparent electrode, a hydrogen storage device, an optical fiber, a sensor and/or another electrical device. The graphene nano ribbons may be used in various combinations of devices.

Figure 2:
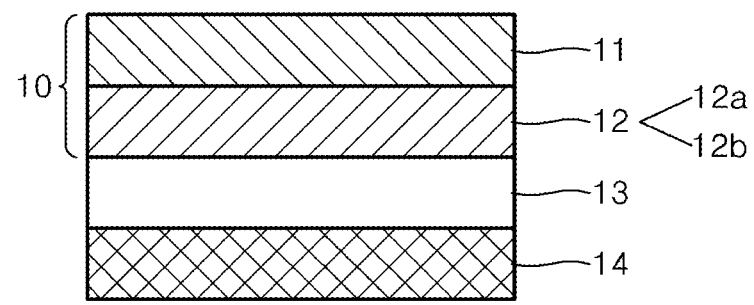

FIG. 2 is a cross-sectional diagram of a solar cell including graphene nano ribbons according to example embodiments. Examples of solar cells including the graphene nano ribbons according to example embodiments include a dye-sensitized solar cell illustrated in FIG. 2. The dye-sensitized solar cell may include a semiconductor electrode 10, an electrolyte layer 13 and an opposing electrode 14. The semiconductor electrode 10 may include a conductive transparent substrate 11 and a light absorbing layer 12, and may be prepared by coating a colloid solution of a nanoparticulate oxide 12a on a conductive glass substrate, heating the coating in a high temperature furnace, and adsorbing a dye 12b thereon.

A transparent electrode including the graphene nano ribbons may be used as the conductive transparent substrate 11. Such a transparent electrode may be prepared by forming graphene nano ribbons on a transparent substrate according to the manufacturing method described above. Examples of the transparent substrate are transparent polymers (e.g., polyethylene terephthalate, polycarbonate, polyimide and/or polyethylene naphthalate) and/or a glass substrate. The transparent electrode may also be used as an opposing electrode 14. In order to form the dye-sensitized solar cell in a bendable configuration, for example, in a cylindrical structure, the opposing electrode, or the like in addition to the transparent electrode, may need to be formed of a flexible material.

The nanoparticulate oxide 12a used in the solar cell may be a semiconductor particle, for example an n-type semiconductor, which provides an anode current as a result of electrons ejected due to light excitation. The nanoparticulate oxide 12a may include at least one of $TiO_2$, $SnO_2$, $ZnO_2$, $WO_3$, $Nb_2O_5$, $Al_2O_3$, $MgO$, $TiSrO_3$, and/or the like. The nanoparticulate oxide 12a may include anatase-type $TiO_2$. The oxide is not limited thereto. The metal oxide may be used alone or in a combination of at least two. A surface area of the semiconductor particles may be a large surface area in order for the dye adsorbed on the surface of the semiconductor particles to absorb a large amount of light. An average particle diameter of the semiconductor particles may be about 20 nm or less.

Any dye that is commonly used in solar cells or photoelectric cells may be used as a dye 12b without limitation and, for example, a ruthenium complex may be used. Examples of a ruthenium complex may include $RuL_2(SCN)_2$, $RuL_2(H_2O)_2$, $RuL_3$ and/or $RuL_2$, where L is 2,2'-bipyridyl-4,4'-dicarboxylate, and/or the like. Any dye with a charge separating capability and sensitization can be used as the dye 12b without limitation. Examples of the dye 12b may include a xanthine dye (e.g., rhodamine B, rose bengal, eosin and/or erythrosine), a cyanine dye (e.g., quinocyanine and/or kryptocyanine), a basic dye (e.g., phenosafranine, tyocyn and/or methylene blue), a porphyrin-based compound (e.g., chlorophyll, Zn porphyrin and/or Mg porphyrin), an azo dye, a complex (e.g., phthalocyanine and/or Ru trisbipyridyl), an anthraquinone-based dye and/or a polycyclic quinone-based dye. Anthraquinone-based dyes and polycyclic quinone-based dyes that are part of a ruthenium complex may also be used. The aforementioned dyes may be used alone or in a combination of at least two.

The thickness of a light absorbing layer 12 including a nanoparticulate oxide 12a and a dye 12b may be about 15 micrometers (microns), and may be in the range of about 1 to about 15 microns, because a series resistance of the light absorbing layer 12 may be high due to a structure of the light absorbing layer 12 and the increased series resistance may cause reduction in conversion efficiency. The thickness of the light absorbing layer 12 may be controlled to less than about 15 microns in order to maintain function and to maintain a low level and/or decreased series resistance and prevent and/or reduce reduction in conversion efficiency.

The electrolyte layer 13 of the dye-sensitized solar cell may be a liquid electrolyte, an ionic liquid electrolyte, an ionic gel electrolyte, a polymer electrolyte and/or a complex thereof. The electrolyte layer 13 may be mainly formed of an electrolyte and may include the light absorbing layer 12. The electrolyte may be infiltrated into the light absorbing layer 12 to form the electrolyte layer 13. An iodide-acetonitrile solution may be used as the electrolyte, but any material with, for example, hole transporting capability can be used without limitation.

The dye-sensitized solar cell may include a catalyst layer (not shown). The catalyst layer may facilitate oxidation and reduction reaction of the dye-sensitized solar cell. Platinum, carbon, graphite, carbon nanotubes, carbon black, p-type semiconductors and/or a complex(es) thereof may be used as the catalyst. The catalyst layer may be between the electrolyte layer 13 and the opposing electrode 14. The surface area of the catalyst may be enlarged using microstructure. For example, platinum black may be employed for platinum catalysts and porous carbon may be employed for carbon catalysts. The platinum black may be prepared by anodizing platinum, treating platinum with chloroplatinic acid and/or the like. The porous carbon may be prepared by sintering carbon particles, calcining an organic polymer and/or the like.

A conductivity of the dye-sensitized solar cell may be excellent and/or improved, and high and/or improved luminance efficiency and processability the dye-sensitized solar cell may be realized, by employing a flexible transparent electrode including graphene nano ribbons.

According to other example embodiments, a fuel cell may include graphene nano ribbons. The fuel cell may include an anode, a cathode, and an electrolyte membrane interposed between the anode and the cathode. The anode may generate hydrogen ions and electrons due to a hydrogen oxidation reaction (HOR) ($H_2 \rightarrow 2H^+ + 2e^-$), protons ($H^+$) may be diffused to the cathode along the electrolyte membrane, and electrons may be moved along an external circuit. An oxygen reduction reaction (ORR) may occur in the cathode and water may be generated ($2H^+ + 2e^- + \frac{1}{2}O_2 \rightarrow H_2O$). Protons ($H^+$) may be provided from the electrolyte membrane and electrons may be provided from the external circuit. The fuel cell may be implemented as, for example, a phosphoric acid fuel cell (PAFC), a polymer electrolyte membrane fuel cell (PEMFC), and/or a direct methanol fuel cell (DMFC). The electrode catalyst for a fuel cell may be applied to a cathode of a fuel cell.

Figure 3:
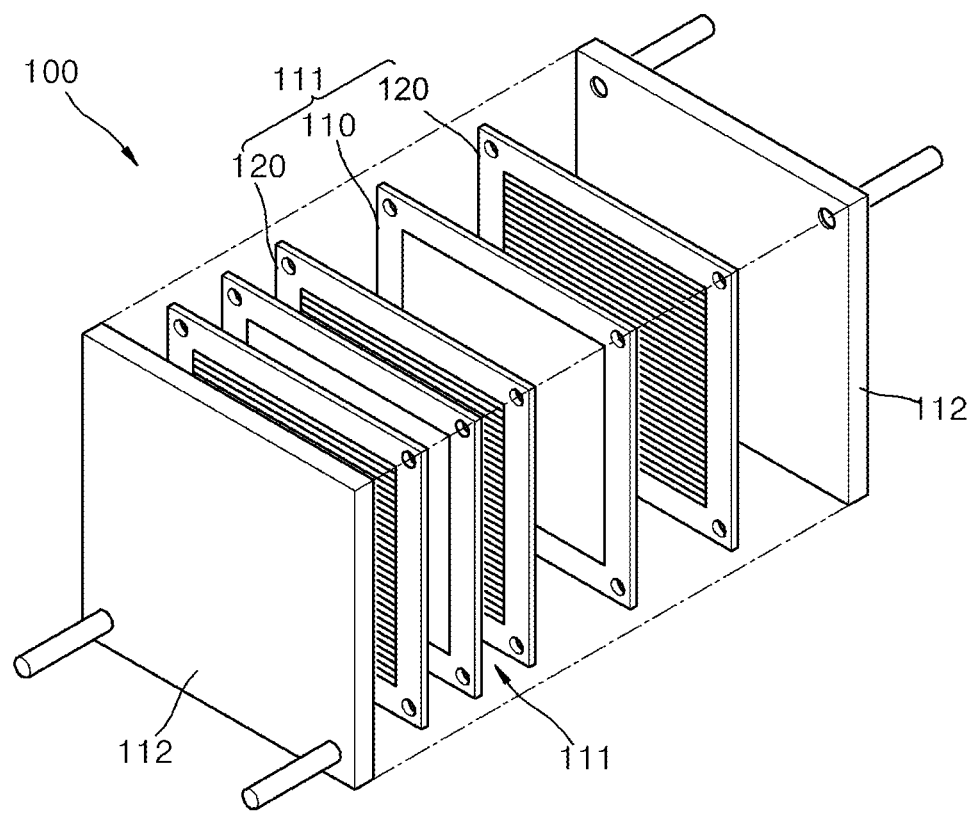
Figure 4:
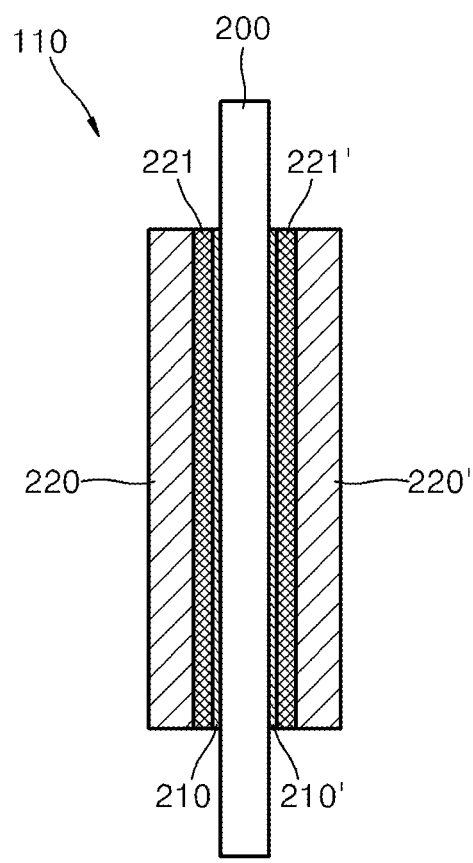
FIG. 4 is a cross-sectional diagram of a membrane-electrode assembly (MEA) of the fuel cell of FIG. 3.

FIG. 3 is a perspective exploded view of a fuel cell 100 according to some example embodiments and FIG. 4 is a cross-sectional diagram of a membrane-electrode assembly (MEA) 110 of the fuel cell 100 of FIG. 3. Referring to FIG. 3, the fuel cell 100 may include two unit cells 111 that are supported by a pair of holders 112. Each unit cell 111 may include the MEA 110 and bipolar plates 120 on opposite sides of the MEA 110. The bipolar plates 120 may each include a conductive metal, carbon, and/or the like, and may bond to the MEA 110, function as current collectors, and provide oxygen and/or fuel to catalyst layers of the MEAs 110. Although only two unit cells 111 are shown in the fuel cell 100 of FIG. 3, the number of unit cells is not limited to two and a fuel cell may have several tens or hundreds of unit cells, depending on the required properties of the fuel cell.

Referring to FIG. 4, each MEA 110 may include an electrolyte membrane 200, catalyst layers 210 and 210' on opposite sides of the electrolyte membrane 200 in the thickness direction thereof, first gas diffusion layers 221 and 221' stacked on the catalyst layers 110 and 110', and second gas diffusion layers 220 and 220' stacked on the first gas diffusion layers 221 and 221'. The electrolyte membrane 200 may be, for example, a polybenzimidazol electrolyte membrane, a polybenzoxazine-polybenzimidazol copolymer electrolyte membrane, and/or a polytetrafluoroethylene (PTFE) porous membrane.

The catalyst layers 210 and 210' may respectively function as a fuel electrode and an oxygen electrode, and each may include a catalyst and a binder therein. The catalyst layers 210 and 210' may include at least one material that increases the electrochemical surface area of the catalyst. Examples of the catalyst may include at least one of a platinum (Pt), an alloy of platinum (Pt) and/or at least one metal (e.g., gold (Au), palladium (Pd), rhodium (Rh), iridium (Ir), ruthenium (Ru), tin (Sn), molybdenum (Mo), cobalt (Co), and/or chromium (Cr) and/or mixtures thereof), and/or a supported catalyst, in which the catalytic metal is supported on a carbon-based support. For example, a catalytic metal may include at least one of platinum (Pt), platinum cobalt (PtCo), and/or platinum ruthenium (PtRu) and/or a supported catalyst, in which the catalytic metal is supported on a carbon-based support is used as the catalyst. Examples of the binder may include at least one of poly(vinylidene fluoride), polytetrafluoroethylene, tetrafluoroethylene-hexafluoroethylene copolymer, and perfluoroethylene. The amount of the binder may be about 0.001 to about 0.5 parts by weight based on 1 part by weight of the catalyst. If the amount of the binder is in the above range, a wet condition of an electrode may be efficiently improved.

The first gas diffusion layers 221 and 221' and the second gas diffusion layers 220 and 220' may each be formed of a material, for example, carbon sheet and/or carbon paper. The first gas diffusion layers 221 and 221' and the second gas diffusion layers 220 and 220' may diffuse oxygen and fuel supplied through the bipolar plates 120 into the entire surfaces of the catalyst layers 210 and 210'.

The graphene nano ribbons according to at least one example embodiment may be used in the gas diffusion layers, the bipolar plates and/or the catalyst layers. The fuel cell 100 including the MEA 110 may operate at a temperature of about 50 to about 300° C. Fuel (e.g., hydrogen) may be supplied through one of the bipolar plates 120 into one of the catalyst layers 210 and 210', and an oxidant (e.g., oxygen) may be supplied through another bipolar plate 120 into the other catalyst layer 210 or 210'. Hydrogen may be oxidized into protons ($H^+$) in the catalyst layer 210 or 210', and the protons ($H^+$) may be conducted to the other catalyst layer 210 or 210' through the electrolyte membrane 200. The protons ($H^+$) may electrochemically react with oxygen in the other catalyst layer 210 or 210' to produce water ($H_2O$) and generate electrical energy. Hydrogen supplied as a fuel may be, for example, hydrogen produced by reforming hydrocarbons and/or alcohols. Oxygen supplied as an oxidant may be supplied in the form of, for example, ambient atmosphere.

According to still other example embodiments, examples of display devices using a transparent electrode including graphene nano ribbons may include an electronic paper display device, an organic light emitting device and/or a liquid crystal display device. The organic light emitting device may be an active light emitting display device that emits light by recombination of electrons and holes in a thin layer made of a fluorescent or phosphorescent organic compound when a current is applied to the thin layer. An example of an organic light emitting device is one with a structure that includes an anode, a hole transport layer, an emitting layer, an electron transport layer and a cathode which are on a substrate (e.g., sequentially formed on a substrate).

In order to facilitate the injection of electrons and holes, the organic light emitting device may include an electron injection layer and a hole injection layer. A hole blocking layer, a buffer layer, and/or the like may be included. It is desirable for the anode to be of high transparency and electrical conductivity, and a transparent electrode with graphene nano ribbons according to example embodiments may be efficiently applied to the anode. The hole transport layer may include, for example, polytriphenylamine, but any material that is commonly used as a hole transport layer may be used without limitation. The electron transport layer may include, for example, polyoxadiazole, but any material that is commonly used to form an electron transport layer may be used without limitation.

Any fluorescent and/or phosphorescent materials that are commonly used in the art as an emitting material may be used to form the emitting layer without limitation. The emitting material may include a polymer host, a low molecular weight host, a non-radiative polymer matrix, and/or a mixture of a polymer and a low molecular weight host. Any of the polymer host, the low molecular weight host and the non-radiative polymer matrix that are commonly used in the formation of an emitting layer for an organic light emitting device may be used. Examples of the polymer host may include poly(vinylcarbazole), polyfluorene, poly(p-phenylene vinylene) and/or polythiophene. Examples of the low molecular weight host may include 4,4'-N,N'-dicarbazol-biphenyl (CBP), 4,4'-bis[9-(3,6-biphenylcarbozolyl)]-1-1,1'-biphenyl{4,4'-bis[9-(3,6-biphenylcarbazolyl)]-1-1,1'-biphenyl}, 9,10-bis[(2',7'-t-butyl)-9',9"-(spirobifluorenyl)anthracene and/or tetrafluorene. Examples of the non-radiative polymer matrix may include polymethylmethacrylate and/or polystyrene. The emitting layer may be prepared by vacuum deposition, sputtering, printing, coating, inkjet and/or the like.

The organic light emitting device according to at least one example embodiment may be prepared using emitting materials that are commonly used in the preparation of an organic light emitting device without particular devices or methods.

According to further example embodiments, the graphene nano ribbons may be used in various electrical devices, for example, a sensor, a bipolar junction transistor, a field effect transistor, a heterojunction bipolar transistor, a single electron transistor, a light emitting diode and/or an organic electroluminescent diode. In such devices, the graphene nano ribbons may be used in a channel layer, an electrode and/or a buffer layer between the channel layer and the electrode.

Figure 5:
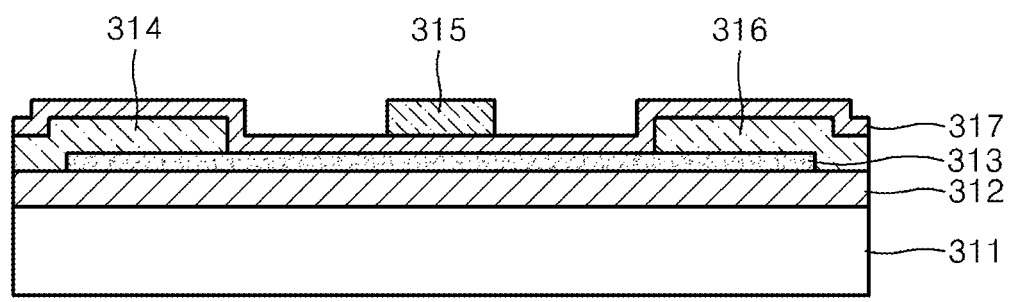
FIG. 5 is a schematic view of a field effect transistor (FET) including graphene nano ribbons according to example embodiments.

FIG. 5 is a schematic view of a field effect transistor (FET) according to at least one example embodiment. Referring to FIG. 5, a silica substrate 312 may be on a substrate 311, and a graphene nano ribbon 313 may be on the silica substrate 312 as a channel layer. A source electrode 314 and a drain electrode 316 may be on left and right sides, respectively, and an insulating layer 317 may separate the source and drain electrodes 314 and 316 from a gate electrode 315. A current flowing between the source and drain electrodes 314 and 316 may be controlled by applying a voltage to the gate electrode 315. The alkali metal-containing monolayer graphene 313 may constitute a channel region, and a current flowing between the source electrode and the drain electrode may be controlled by applying a voltage to the gate electrode, thereby performing on/off operations.

The distance between the source electrode 314 and the drain electrode 316 may be dependent upon the purpose of a field effect transistor, and may be about 0.1 μm to about 1 mm. For example, the distance between the source electrode 314 and the drain electrode 316 may be about 1 μm to about 100 μm, for example, about 5 μm to about 100 μm. In a field effect transistor according to example embodiments, the insulating layer 317 may be any electrically insulating material in thin film form. Examples of the electrically insulating material may include a metal oxide (including oxide of silicon), a metal nitride (including nitride of silicon), a polymer, and/or a low molecular weight organic material, an electrical resistance of each of which may be about 10 Ω cm or more. For example, the insulating layer 317 may be an inorganic oxide with a high relative dielectric constant.

Examples of an inorganic oxide may include silicon oxide, aluminum oxide, tantalum oxide, titanium oxide, tin oxide, vanadium oxide, titanium acid barium strontium, zirconium acid titanium acid barium, zirconium acid titanium acid lead, titanium acid lead lanthanum, titanium acid strontium, titanium acid barium, barium magnesium fluoride, lanthanum oxide, fluorine oxide, magnesium oxide, bismuth oxide, titanium acid bismuth, niobyum oxide, titanium acid strontium bismuth, tantalum acid strontium bismuth, tantalum pentoxide, tantalum acid niobium acid bismuth, trioxide yttrium, and/or a combination thereof. For example, the inorganic oxide may be silicon oxide, aluminum oxide, tantalum oxide, and/or titanium oxide. An inorganic nitride, for example, a silicon nitride ($Si_3N_4$, $Si_xN_y$ (x, y>0)) and/or an aluminum nitride may be used as an insulating layer 317.

The insulating layer 317 may be formed using a precursor material containing an alkoxide metal. For example, a solution including the precursor material may be coated onto a substrate and then may be subjected to a chemical solution treatment including a heat treatment process, thereby forming an insulating layer. The alkoxide metal may include a metal and an alkoxide. The metal included in the alkoxide metal may be, for example, at least one of transition metals, lanthanoides, and/or main group elements. For example, the metal may include barium (Ba), strontium (Sr), titanium (Ti), bismuth (Bi), tantalum (Ta), zirconium(Zr), iron (Fe), nickel (Ni), manganese (Mn), lead (Pb), lanthanum (La), lithium (Li), sodium (Na), potassium (K), rubidium (Rb), cesium (Cs), francium (Fr), beryllium (Be), magnesium(Mg), calcium (Ca), niobium (Nb), thallium (Tl), mercury (Hg), copper(Cu), cobalt (Co), rhodium (Rh), scandium (Sc), and or yttrium (Y). The alkoxide included in the alkoxide metal may be derived from alcohols and/or alkoxy alcohols. Examples of the alcohols may include methanol, ethanol, propanol, isopropanol, butanol and isobutanol. Examples of the alkoxy alcohols may include methoxy ethanol, ethoxy ethanol, propoxy ethanol, butoxy ethanol, pentoxy ethanol, heptoxy ethanol, methoxy propanol, ethoxy propanol, propoxy propanol, butoxy propanol, pentoxy propanol and heptoxy propanol.

If the insulating layer 317 includes such materials, polarization in the insulating layer may be facilitated, and a threshold voltage for driving a transistor may be lowered. When a silicon nitride, for example, $Si_3N_4$, $Si_xN_y$, and/or $SiON_x$(x, y>0), is included in the insulating layer, a depletion layer may be more easily formed and the threshold voltage for driving a transistor may be lowered.

Examples of a low molecular weight organic material may include a polyimide, poly amide, polyester, polyacrylate, an optical radical polymerization system, a photocurable resin of an optical cation polymerization system, an acrylonitrile-containing copolymer, a polybiphenole, polybivinylalcohol, a novolac resin, and/or cyanoethylpullulan. Examples of the polymer may include wax, polyethylene, polychloropyrene, polyethylenetelephthalate, polyoxymethylene, polybinylchloride, polyvinylidene fluoride, polymethylmethacrylate, polysulfone, polycarbonate, polyimidcyanoethyl pullulan, poly(binylphenol)(PVP), poly(methylmethacrylate) (PMMA), polycarbonate (PC), polystyrene (PS), polyolefin, polyacrylamide, poly(acrylic acid), novolak resin, resol resin, polyimid, polyxylene, epoxy resin, and/or a polymer of high dielectric constant (e.g., pullulan).

The insulating layer 317 may be a mixed layer including at least two materials selected from the inorganic or organic compounds described above, and/or may be a stacked structure including layers formed of the inorganic and organic compounds. Performance of manufactured device may be controlled by mixing a high dielectric constant material and a water repellant material and/or by stacking a layer including a high dielectric constant material and a water repellant material.

The insulating layer 317 may be formed by, for example, using a dry process, a coating process and/or a wetting process. Examples of the dry process may include a vacuum deposition method, a molecular beam epitaxial growth method, an ion cluster beam method, a low energy ion beam method, an ion plating method, a chemical vapor deposition (CVD) method, a sputtering method and/or an atmospheric plasma method. Examples of the coating method may include a spray coating method, a spin coating method, a blade coating method, a dip coating method, a casting coating method, a roll coating method, a bar coating method and/or a dye coating method. Examples of the wetting process may include a printing method and/or an ink-jetting method. These methods may be appropriately selected according to a material for forming the insulating layer. The wetting process may be performed using, for example, a sol-gel method. An example of the wetting process may include a sol-gel method in which a dispersion prepared by dispersing particulates of inorganic oxide in an organic solvent and/or water by using a dispersing agent (e.g., a surfactant) is coated and dried, and/or a solution of an oxide precursor (e.g., an alkoxide) is coated and then dried.

A metallic atomic layer and/or metallic ion layer may be between the alkali metal-containing monolayer graphene 313 as a semiconductor layer and the insulating layer 317. The metallic atomic layer may include, for example, Zn, Al, Ga, Zr, Ni, Co, Pd and/or a mixture thereof. The metallic ion layer may include, for example, an ion of Zn, Al, Ga, Zr, Ni, Co, Pd and/or a mixture thereof, each of which may be a metallic salt. An anion corresponding to the metallic salt may be, for example, halogen, $(COOH)^{-1}$, $NO_3^{2-}$, $SO_4^{2-}$, and/or $CO_3^{-2}$. A thickness of the metallic atomic layer and/or metallic ion layer may be equivalent to a 1-3 layered structure of a metallic atom and/or a metallic ion.

The metal atomic and/or metal ionic layer may be formed using any method known in the field. For example, the metal atomic and/or metal ionic layer may be formed using a dry process, a coating process and/or a wetting process. Examples of the dry process may include a vacuum deposition method, a molecular beam epitaxial growth method, an ion cluster beam method, a low energy ion beam method, an ion plating method, a chemical vapor deposition (CVD) method, a sputtering method and/or an atmospheric plasma method. Examples of the coating method may include a spray coating method, a spin coating method, a blade coating method, a dip coating method, a casting coating method, a roll coating method, a bar coating method and/or a dye coating method. Examples of the wetting process may include a printing method and/or an ink-jetting method. These methods may be appropriately selected according to a material for forming the insulating layer.

In a field-effect transistor, for example, a thin film transistor (TFT), a substrate that supports the structure of the TFT may be, for example, a glass substrate, an inorganic compound (e.g., a metal oxide and/or nitride) substrate, a plastic film (e.g., PET, PES and/or PC), a metal substrate, and/or a composite or stack thereof. If other elements, not the substrate, sufficiently support the structure of a thin film transistor, the substrate may not be used. In general, a silicon (Si) wafer may be used as a substrate. The Si itself may be used as both a gate electrode and a substrate. A surface of a Si substrate may be oxidized to form $SiO_2$ which functions as an insulating layer. A metal layer, for example, a gold (Au) layer as an electrode for connection to a lead line may be on the Si substrate functioning both as a substrate and a gate electrode.

In a TFT according to at least one example embodiment, gate, source and drain electrodes may include any conductive materials. For example, each of the gate, source, and drain electrodes may be formed of platinum (Pt), gold (Au), silver (Ag), nickel (Ni), chromium (Cr), copper (Cu), iron (Fe), tin (Sn), hard lead (Pb), tantalum (Ta), indium (In), palladium (Pd), tellurium (Te), rhenium (Re), iridium (Ir), aluminum (Al), ruthenium (Ru), germanium (Ge), molybdenum (Mo), tungsten (W), tin oxide antimony, indium oxide tin (ITO), fluoride-doped zinc oxide, zinc (Zn), carbon (C), graphite, glass-phase carbon, silver paste, carbon paste, lithium (Li), beryllium (Be), sodium (Na), magnesium (Mg), potassium (K), calcium (Ca), scandium (Sc), titanium (Ti), manganese (Mn), zirconium (Zr), gallium (Ga), niobium (Nb), an alloy containing sodium (Na) and potassium (K), magnesium (Mg), lithium (Li), aluminum (Al), a mixture containing magnesium (Mg) and copper (Cu), a mixture containing magnesium (Mg) and silver (Ag), a mixture containing magnesium (Mg) and aluminum (Al), a mixture containing magnesium (Mg) and indium (In), a mixture containing aluminum (Al) and aluminum oxide, and/or a mixture containing lithium (Li) and aluminum (Al). These materials may be deposited by, for example, sputtering and/or vacuum deposition.

In a TFT according to yet other example embodiments, source and drain electrodes may be of a fluid electrode material, for example, a solution, paste, ink and/or dispersion of such conductive materials. A metallic particulate-containing dispersion may be any known conductive paste, and may be a dispersion of metallic particulates with a particle diameter of about 0.5 nm to about 50 nm, or about 1 nm to about 10 nm. Such metallic particulates may be, for example, platinum (Pt), gold (Au), silver (Ag), nickel (Ni), chromium (Cr), copper (Cu), iron (Fe), tin (Sn), hard lead (Pb), tantalum (Ta), indium (In), palladium (Pd), tellurium (Te), rhenium (Re), iridium (Ir), aluminum (Al), ruthenium (Ru), germanium (Ge), molybdenum (Mo), tungsten (W), and/or zinc (Zn).

Such metallic particulates may be dispersed in a dispersion medium, for example, water and/or any organic solvent by using a dispersion stabilizer, for example, an organic material, and the obtained dispersions may be used to form the source electrode and the drain electrode. The dispersions of such metallic particulates may be prepared using, for example, a physical method (e.g., sputtering and/or metal vapor synthesis) and/or a chemical method in which metallic ions are reduced into a liquid phase to generate metallic particulates. Examples of a chemical method include a colloid method and/or a co-precipitation method.

The source electrode and the drain electrode may be molded using such metallic particulate dispersions, and a solvent used may be dried, and the molded structure may be heated at a temperature of about 100° C. to about 300° C., for example, about 150° C. to about 200° C. while maintaining the shape of the molded structure, thereby thermally fusing metallic particulates to form an electrode pattern with a target shape. The gate, source and drain electrodes may include a known conductive polymer that obtains a high conductivity due to doping, for example, conductive polyanilin, conductive polypyrrole, conductive polythiophene (a comoplex of polyethylenedioxythiophene and/or polystyrenesulfonic acid), and/or a complex of polyethylenedioxythiophene (PEDOT) and/or polystyrenesulfonic acid. When these materials are used, a contact resistance between the source and drain electrodes and the semiconductor layer may be reduced.

Among the materials of the source and drain electrodes described above, the source electrode and the drain electrode may include a material that facilitates a contact surface between the source and drain electrodes and the semiconductor layer to be of small and/or reduced electrical resistance. The electrical resistance may correspond to an electric field mobility when a current-control device is manufactured, and a high electric field mobility may be obtained when the electric resistance is low.

The gate, source and drain electrodes may be formed by, for example, deposition, electron-beam deposition, sputtering, an atmospheric plasma method, ion plating, chemical vapor deposition (CVD), electrodeposition, electroless deposition, spin coating, printing, and/or ink-jetting. If patterning is further needed to form the gate, source and drain electrodes, a conductive thin film formed by such methods may be patterned by known photolithography and/or lift-off methods. A metal thin film of aluminum and/or copper may be patterned by, for example, forming a resist by thermal transfer and/or ink-jetting and then performing an etch thereon. A solution or dispersion of a conductive polymer, and/or a dispersion containing a metallic particulate may be directly ink-jetted to form a pattern. A lithography and/or laser polishing may be performed through a porous layer to form a pattern. A conductive polymer, a metallic particulate-containing conductive ink, and/or a conductive paste may form a pattern by relief printing, engraving printing, flat panel printing, and/or screen printing.

A thickness of the electrode may not be limited as long as a current flows therethrough, and may be, for example, about 0.2 nm to about 10 μm or about 4 nm to about 300 nm. If the thickness of each of the source and drain electrodes is within this range, a resistance may be high due to the small thickness and a voltage drop may not occur. In a TFT according to yet still other example embodiments, a buffer layer may be between the semiconductor layer and the source and drain electrodes in order to improve injection efficiency. In the case of the n-type TFT, the buffer layer may be an alkali metal (e.g., LiF, $Li_2O$, CsF, $NaCO_3$, KCl, $MgF_2$, and/or $CaCO_3$), an alkali earth metal, and/or a compound with an ionization bond, all of which may be used in an anode of an organic light emitting device. A compound that is used to form an electron injection layer and/or an electron transport layer of an organic light emitting device, for example, Alq(tris(8-quinolinol)aluminum complex), may also be used as the buffer layer.

The buffer layer may lower an injection barrier of carriers and lower a threshold voltage, and may facilitate a transistor to be driven at low voltage. The buffer layer may, for example, be located anywhere between the source and drain electrodes and the semiconductor layer while being thin. The thickness of the buffer layer may be about 0.1 nm to about 30 nm, or about 0.3 nm to about 20 nm.

The TFT may be electrically connected to a light emitting device and the light emitting device may be controlled by changing a current flowing between the source electrode and the drain electrode. The TFT and the light emitting device may be part of a flat panel display.

The following example is for illustrative purposes only and not limiting of example embodiments.

A silica ($SiO_2$) wafer with a size of 1 cm×1 cm and a thickness of 300 nm was prepared. Two-layered graphene having a size of 1 cm×1 cm was transferred onto the silica ($SiO_2$) wafer. Then, amorphous carbon was coated on the graphene to have a thickness of about 20 nm by using CVD coating. While laser light having a wavelength of about 532 nm was irradiated to the amorphous carbon layer by using laser equipment with an intensity of about 100 mW, an interval of a pattern was adjusted so as to form a nano pattern having width of about 40 to about 100 nm. The stacked structure was disposed in a vapor thermal treatment chamber and the chamber was thermally treated under $H_2$:$CH_4$=100:50 sccm for about 1 hour at about 700° C. Amorphous carbon existing on the graphene was removed, thereby preparing desired graphene nano ribbons.

Figure 6:
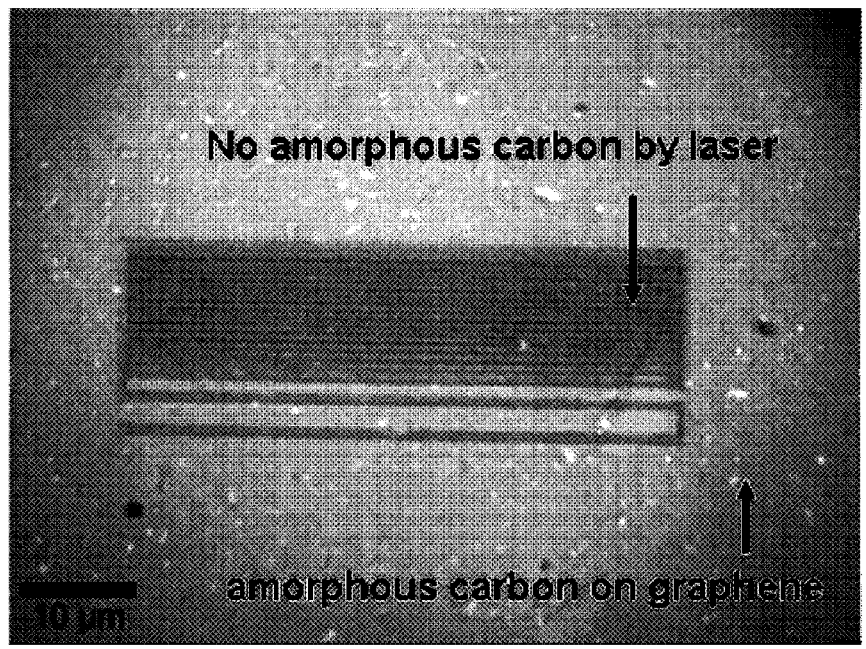
FIG. 6 is an optical image of an amorphous carbon nano pattern according to example embodiments.
Figure 7:
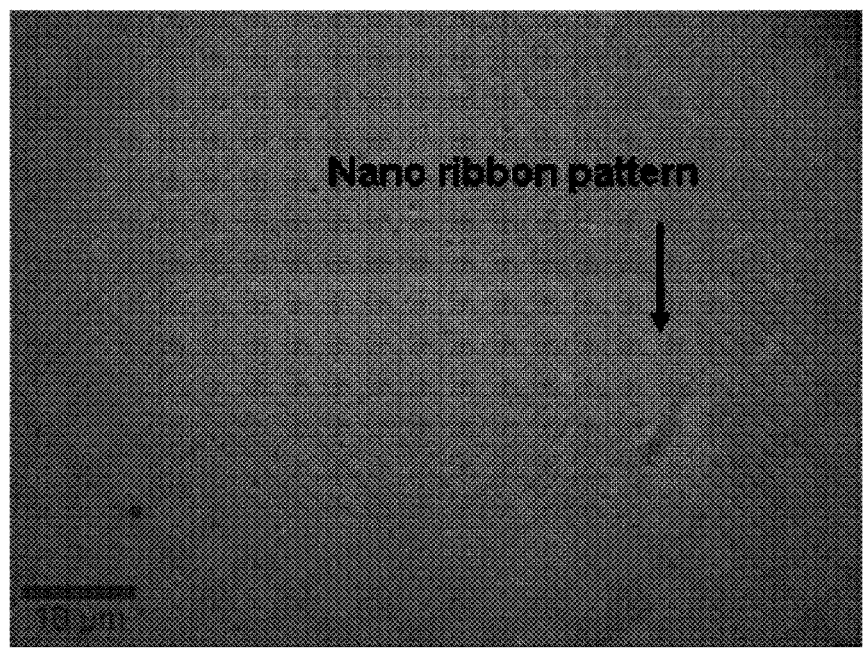
FIG. 7 is an optical image of a nano pattern of graphene nano ribbons according to example embodiments.

FIG. 6 is an optical image of a nano pattern obtained by laser irradiation after an amorphous carbon layer is formed on the graphene and FIG. 7 is an optical image of the graphene nano ribbon on which the nano pattern is formed after plasma and thermal treatment.

According to example embodiments, a high-degree vacuum and/or expensive equipment may not be required in methods of preparing graphene nano ribbons and the graphene nano ribbons may be prepared in an economical way under improved conditions. Such a graphene nano ribbon may be applied to various fields such as transparent electrodes and/or electric devices.

While example embodiments have been particularly shown and described, it will be understood by one of ordinary skill in the art that variations in form and detail may be made therein without departing from the spirit and scope of the claims.

What is claimed is:

1. A method of preparing a graphene nano ribbon, the method comprising:
    depositing a graphene sheet on at least one surface of a substrate;
    forming a plasma mask with a nano ribbon pattern on the graphene sheet; and
    forming a nano ribbon pattern in the graphene sheet by plasma treating a stack structure including the plasma mask to obtain a graphene nano ribbon,
    wherein the forming of the plasma mask includes:
        stacking amorphous carbon on the graphene sheet; and
        forming the nano ribbon pattern in the amorphous carbon by irradiating the amorphous carbon with light to obtain the plasma mask.

2. The method of claim 1, further comprising:
    removing the plasma mask after the forming of the nano ribbon pattern in the graphene sheet.

3. The method of claim 2, wherein the removing of the plasma mask includes thermally treating the stack structure including the plasma mask for about 10 minutes to about 5 hours at about 400-1200 ° C. in an atmosphere including at least one of $O_2$, $H_2$, $CH_4$, $C_2H_4$, and $C_2H_2$.

4. The method of claim 1, wherein the graphene sheet includes 1-10 layers of graphene.

5. The method of claim 1, wherein the graphene sheet includes one of 1 and 2 layers of graphene.

6. The method of claim 1, wherein the light irradiation of the amorphous carbon includes laser light irradiation.

7. The method of claim 1, wherein the forming of the nano ribbon pattern in the graphene sheet includes controlling an intensity of the plasma based on a thickness of the graphene sheet.

8. The method of claim 1, wherein the substrate includes at least one of a silicon (Si) substrate, a glass substrate, a GaN substrate, a silica substrate, and a metal substrate including at least one of nickel (Ni), cobalt (Co), iron (Fe), platinum (Pt), palladium (Pd), gold (Au), aluminum (Al), chromium (Cr), copper (Cu), manganese (Mn), molybdenum (Mo), rhodium (Rh), iridium (Ir), tantalum (Ta), titanium (Ti), tungsten (W), uranium (U), vanadium (V), and zirconium (Zr).

9. The method of claim 1, wherein the depositing of the graphene sheet includes depositing the graphene sheet with an area of equal to or greater than about 1 $cm^2$.

10. The method of claim 1, wherein the depositing of the graphene sheet includes depositing the graphene sheet with less than or equal to 10 wrinkles per 1000$\mu m^2$ of graphene.

11. The method of claim 1, wherein graphene sheet includes greater than or equal to 99% graphene per 1 $mm^2$ of the graphene sheet.

12. A method of preparing a grapheme nano ribbon, the method comprising:
    forming a carbon mask on a graphene sheet, the carbon mask comprising a carbon layer including amorphous carbon, the graphene sheet including at least one graphene layer, and
    plasma treating the graphene sheet to form a graphene nano ribbon.

13. The method of claim 12, further comprising:
    thermally treating the graphene nano ribbon and the carbon mask to remove the carbon mask.

14. The method of claim 12, wherein the forming of the carbon mask includes irradiating the carbon layer with a laser without the presence of a photoresist to form the carbon mask.

15. The method of claim 12, wherein the forming of the carbon mask includes depositing the carbon layer using chemical vapor deposition (CVD).

* * * * *